July 16, 1963 P. E. CARNEY ETAL 3,098,199

AUTOMATIC GAIN CONTROL CIRCUIT

Filed Feb. 1, 1962

P. E. CARNEY
J. H. KEAHEY
INVENTORS.

BY John G. Graham

United States Patent Office 3,098,199
Patented July 16, 1963

3,098,199

AUTOMATIC GAIN CONTROL CIRCUIT

Patrick Edward Carney, Orlando, Fla., and Joe H. Keahey, Dallas, Tex., assignors to Texas Instruments Incorporated, Dallas, Tex., a corporation of Delaware Filed Feb. 1, 1962, Ser. No. 170,611
5 Claims. (Cl. 330—29)

This invention relates to automatic gain control circuits for electronic amplifiers, and more particularly to a system adapted to effectively control the gain of an amplifier regardless of the polarity of input pulses applied thereto.

A video amplifier having a large dynamic range is necessary in microwave receiver applications due to the vary wide range of detected signal amplitudes provided by a crystal detector. It is especially difficult to prevent saturation of a transistorized video amplifier, such as would be used in telemetering or control in missiles where size and weight are important factors, due to the characteristics of transistor devices. Previous attempts at providing the necessary wide dynamic range have made use of logarithmic amplifiers or other techniques which have not been entirely successful due to the fact that signal modulation is not preserved or else input pulses of both polarities are not equally amplified.

It is therefore the principal object of this invention to provide an improved automatic gain control circuit. Another object is to provide an improved video amplifier having a gain control arrangement effective for input signals of both polarities. A further object is to provide a bipolar automatic gain control circuit adapted for use with transistorized amplifiers and effective over a wide dynamic range. An additional object is to provide an improved gain control arrangement for transistorized amplifiers which will not distort signal modulation.

In accordance with this invention, a pair of semiconductor diodes are connected in series opposition in a negative feedback path in an amplifier circuit. A gain control voltage, in the form of a D.C. potential related to the average value of the amplifier output, is applied to the juncture of the two oppositely-poled diodes, as so will determine their bias levels and dynamic resistances. With this arrangement, the attenuation of the negative feedback will be varied in accordance with the magnitude of the gain control voltage, and so the effective gain of the amplifier will be likewise varied. The gain of the amplifier for signal pulses of either polarity will be equal.

Figure 1:
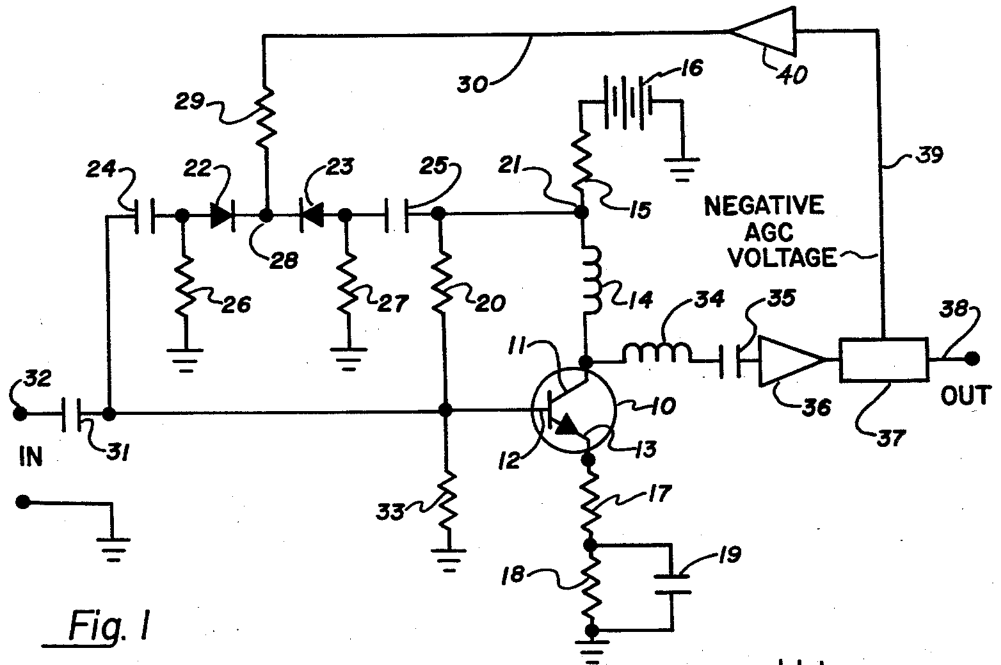
Figure 2:
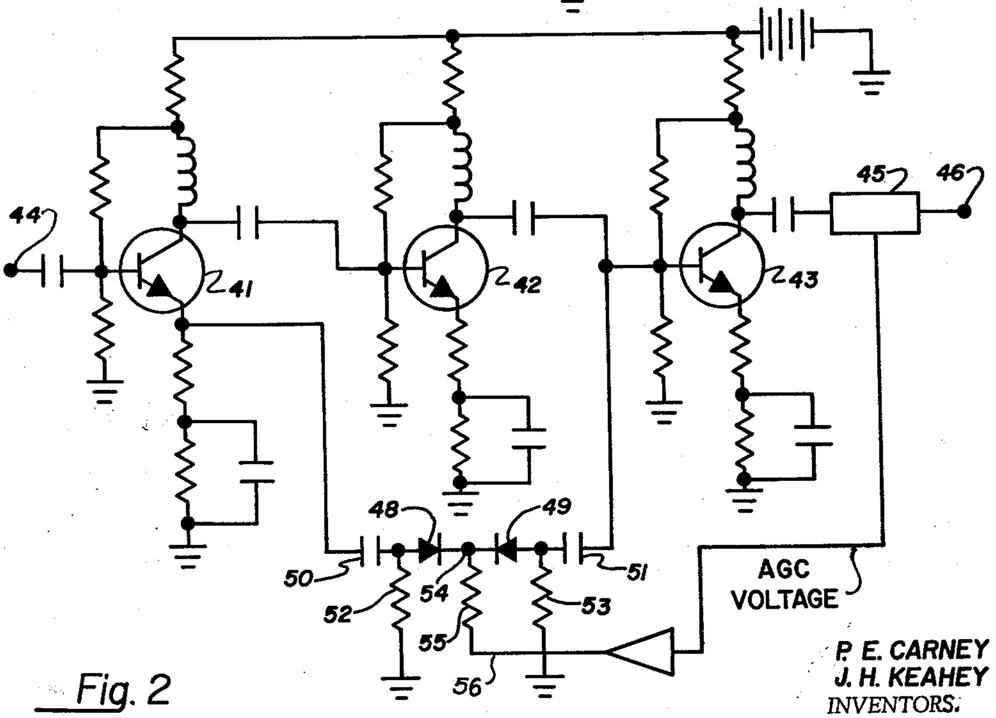

The novel features believed characteristic of the invention are set forth in the appended claims. The invention itself, however, along with further objects and advantages thereof, may best be understood by reference to the following detailed description of particular embodiments, when read in conjunction with the accompanying drawing, wherein:

FIGURE 1 is a schematic diagram of an amplifier circuit incorporating the gain control features of this invention, and FIGURE 2 is a schematic diagram of another embodiment of the invention.

With reference to FIGURE 1, a video amplifier circuit incorporating the bipolar gain control features of this invention is illustrated. A transistor 10 is utilized as the amplifying element and includes a collector 11, a base 12 and emitter 13. The collector 11 is connected through a peaking inductor 14 and a load resistor 15 to the positive terminal of a power supply 16. The emitter 13 is connected through an unbypassed resistor 17, and a resistor 18 which is shunted by a bypass capacitor 19, to ground or the other terminal of the supply 16. A fixed amount of negative feedback from the collector circuit is provided by a resistor 20 which is connected from the base 12 to a junction 21 between the inductor 14 and the resistor 15. A varying amount of negative feedback, resulting in the gain control feature of this invention, is provided by a pair of series-connected, oppositely-poled diodes 22 and 23 which are coupled by a pair of capacitors 24 and 25 between the junction 21 and the base 12. The anodes of the diodes are grounded through like resistors 26 and 27 to provide D.C. return paths for the diode currents. A varying negative gain control voltage is applied to a junction 28 between the diodes 22 and 23 by a resistor 29 which is connected to an AGC line 30. The base 12 is also coupled by a capacitor 31 to an input terminal 32 which is connected to an input source (not shown) that may be a previous amplifier stage. The incoming signals would ordinarily be a train of narrow pulses, both positive and negative, of varying amplitude. The envelope of the pulse train would be the modulation signal in a form such as a sine wave.

The collector 11 of the transistor 10 is connected by a suitable coupling arrangement such as an inductor 34 and a capacitor 35 through further amplifying stages 36, if necessary, and translating means 37 to an output terminal 38. The translating means 37 would include an AGC detecting arrangement such as a diode and an RC circuit adapted to produce a negative AGC voltage related in magnitude to the average amplitude of the signal voltage. This AGC voltage would appear on a line 39 which is connected through an AGC amplifier 40, if necessary, to the AGC line 30.

If the input signal is a train of relatively narrow pulses, it may be necessary to provide a pulse stretching circuit prior to the AGC detector. The output of the stretch circuit, which would be the same as the input in amplitude but each pulse would be lengthened in time, may be coupled to the AGC amplifier through a low-pass filter to insure that all of the high freguency components of the pulses are removed from the gain control voltage. In any case, it is important that the time constant of the gain control circuit is greater than the period of the highest modulation frequency of the amplifier.

In the operation of the embodiment of the invention shown in FIGURE 1, it is seen that a signal applied to the input 32 would be amplified in the circuit of the transistor 10, and by further amplifiers 36, and would appear at an appropriately increased magnitude at the output 38. Until the output signal reaches a certain level, the diodes 22 and 23 will not be forward biased since no AGC voltage will be present. Thus, one or the other of the diodes will block either positive or negative pulses and no feedback will be provided through the path including the diodes. However, when the input signal increases, a negative D.C. gain control voltage related to the average magnitude of the output signals will appear on the line 30. This will establish a given forward bias level for the diodes 22 and 23, and so will determine the amount of negative feedback signal coupled through this path from the junction 21 to the base 12. The dynamic resistance of the semiconductor diodes varies with their bias, and, assuming a given bias level, this resistance would be different for positive-going and negative-going signals due to the nonlinearity of the characteristics. However, since the two diodes are connected in series, the effective resistance seen by a positive-going signal pulse in the negative feedback path will be the same as that seen by a negative-going pulse.

While the particular values of the circuit components used and the circuit of FIGURE 1 would depend upon the application, the following values are given for purposes of illustration only:

| | | |
|---|---|---|
| Resistor **15** | ohm | 3.9K |
| Resistors **17** and **18** | do | 150K |
| Resistor **20** | do | 5.6K |
| Resistors **26** and **27** | do | 10K |
| Resistor **29** | do | 2–10K |
| Capacitor **19** | μfd | 4.7 |
| Capacitors **24** and **25** | μfd | 1.0 |
| Capacitor **31** | μfd | 0.22 |
| Inductor **14** | μhy | 18 |
| Inductor **34** | μhy | 5.6 |
| Diodes **22** and **23** | | 1N252 |
| Transistor **10** | | 2N703 |
| Voltage source **16** | | 48 volt |

In another embodiment of this invention, the variable negative feedback path is connected between the output of one amplifier stage and the input of a preceding amplifier stage. As seen in FIGURE 2, three cascade video amplifier stages are employed. Each of these stages includes the circuit of one of a set of transistors 41, 42, and 43, and each of these circuits is similar in all respects to that of the transistor 10 of FIGURE 1 except for the variable negative feedback path. These three cascade stages are adapted to amplify a signal appearing at an input terminal 44 and, along with further translating means 45 which may include an AGC detector, apply the amplified signal to an output terminal 46. The output of the stage which includes the transistor 42, or the input of the stage including the transistor 43, is coupled back to the emitter of the transistor 41 by a variable negative feedback path. This path includes a pair of diodes 48 and 49 connected in series opposition along with a pair of coupling capacitors 50 and 51. The junctions of the capacitors and diodes are both connected to ground through like resistors 52 and 53. A junction 54 between the diodes 48 and 49 is connected through a resistor 55 to an AGC line 56. The output of the AGC detector and translating means 45 is connected to the negative AGC line 56 through an AGC amplifier if necessary.

The operation of the circuit of FIGURE 2 is similar to that of FIGURE 1 except that the negative feedback is coupled between the collector circuit of the transistor 42 to the emitter circuit of the transistor 41. It is seen that a positive-going pulse applied to the input 44 would appear as an amplified positive-going pulse in the collector circuit of the transistor 42, having been twice inverted. A portion of this amplified positive-going pulse, appearing on the emitter of the transistor 41 would oppose the input pulse and effectively lower the gain of the circuit. The amount of decrease in the overall gain would of course be determined by the magnitude of the negative AGC voltage appearing on the line 56, this latter voltage being related to the output signal amplitude.

While this invention has been described with reference to illustrative embodiments, this description is not meant to be construed in a limiting sense. It is of course understood that various modifications of the illustrated circuits may be made by persons skilled in the art, and so it is contemplated that the appended claims will cover any such modifications as fall within the true scope of the invention.

What is claimed is:

1. A gain control circuit comprising:

(*a*) an amplifying stage having input and output terminals, (*b*) a signal source connected to said input terminal, (*c*) means coupled to said output terminal and adapted to produce a gain control voltage related in magnitude to the amplified signals appearing on said output terminal, (*d*) a negative feedback path between said output and input terminals, said feedback path including a pair of diodes connected together in series opposition, (*e*) and means connecting said gain control voltage to the juncture of said pair of diodes whereby the diodes will both be biased by an amount related to the magnitude of said gain control voltage.

2. A translating circuit with gain control means comprising:

(*a*) a source of input signals in the form of a pulse train including positive-going and negative-going pulses, (*b*) signal amplifying means having an input connected to said source and an output, the amplified input signals appearing at said output being in phase opposition to the input signals appearing at said input.

(*c*) rectifying means coupled to said output and adapted to produce a gain control voltage related in magnitude to the level of the amplified input signals, (*d*) a pair of diodes connected together in series opposition, said pair of diodes being capacitively coupled between said output and input whereby a negative feedback path is provided, (*e*) and means coupling said gain control voltage to the juncture of said pair of diodes such that the diodes will be forward biased in relation to the magnitude of the signal voltage.

3. A gain control circuit comprising:

(*a*) an amplifying stage including a transistor having a base, an emitter, and a collector, the input circuit of said stage including said base and emitter, the output circuit of said stage including said collector and emitter, (*b*) an input signal source connected in said input circuit and adapted to provide a pulse train of positive and negative pulses of varying amplitude defining a modulation signal by the envelope thereof, (*c*) detecting means having an input coupled to said collector to receive amplified signals therefrom and adapted to produce a undirectional voltage at an output related in magnitude to the average level of the amplified modulation signal, said detecting means having a time constant greater than the period of said modulation signal, (*d*) a negative feedback path connected in series between the output and input circuits of said stage and including a pair of oppositely-poled, series-connected semi-conductor diodes each having similar nonlinear forward resistance characteristics, said diodes being capacitively coupled to said collector and said base, (*e*) and means connecting the output of said detecting means to the juncture of said pair of diodes whereby the diodes will both be biased by equal amounts related to the magnitude of said unidirectional voltage.

4. A gain control circuit comprising:

(*a*) a plurality of cascaded signal amplifying stages, each of said stages having an input circuit and an output circuit, (*b*) a source of signals connected in the input circuit of the first of said plurality of amplifying stages, (*c*) detecting means having an input connected in the output circuit of the latter of said plurality of amplifying stages, said detecting means being adapted to produce a unidirectional voltage at an output related in magnitude to the average magnitude of the amplified signals, (*d*) a negative feedback path between the output circuit of one of said signal amplifying stages and the input circuit of a preceding one of said amplifying stages, said feedback path including a pair of diodes connected in series opposition, (*e*) and means connecting the output of said detecting means to the juncture of said pair of diodes whereby the diodes will both be biased by an amount related to the magnitude of said unidirectional voltage.

5. In an amplifier system:

(*a*) a plurality of cascaded signal amplifying stages, each of said stages including one of a plurality of transistors each having a base, an emitter, and a collector, the input circuit of each of said stages including the base and emitter of one of said plurality of transistors, the output circuit of each of said stages including the collector and emitter of one of said plurality of transistors, (*b*) an input signal source coupled to the input circuit of the first of said plurality of amplifying stages, said source providing a pulse train including narrow, spaced, positive-going and negative-going pulses of varying amplitudes defining a modulation signal by the envelope thereof, (*c*) rectifying means having an input coupled to the output circuit of the latter of said plurality of amplifying stages and adapted to produce a gain control voltage related in magnitude to the level of the amplified input signals, (*d*) a negative feedback path capacitively coupled between the collector of the transistor in one of said amplifying stages and the emitter of the transistor in the next preceding one of said amplifying stages, said path including a pair of semiconductor diodes connected together in series opposition, (*e*) and means connecting said rectifying means to the juncture of said pair of diodes whereby said gain control voltage will bias each of said diodes by equal amounts related to the magnitude of the amplified signals and thereby vary the amount of negative feedback to control the overall gain of the amplifier system.

No references cited.